MULTIPLE CHANNEL FIELD EFFECT SEMICONDUCTOR

Filed Dec. 11, 1958 2 Sheets-Sheet 1

INVENTORS H. A. STONE, JR.
R. M. WARNER, JR.
BY H. W. Lockhart
ATTORNEY

MULTIPLE CHANNEL FIELD EFFECT SEMICONDUCTOR

Filed Dec. 11, 1958

INVENTORS H. A. STONE, JR.
R. M. WARNER, JR.
BY H. W. Lockhart
ATTORNEY

3,061,739
MULTIPLE CHANNEL FIELD EFFECT SEMICONDUCTOR

Henry A. Stone, Jr., Bernardsville, and Raymond M. Warner, Jr., Morris Plains, N.J., assignors to Bell Telephone Laboratories, Incorporated, New York, N.Y., a corporation of New York Filed Dec. 11, 1958, Ser. No. 779,593
10 Claims. (Cl. 307—88.5)

This invention relates to semiconductor devices and, more particularly, to multiple channel field effect semiconductor devices.

The principles of operation of field effect semiconductor devices are set forth in United States Patent 2,744,970, issued to W. Shockley on May 8, 1956, as well as in the paper entitled "The Field Effect Transistor" by G. C. Dacey and I. M. Ross, Bell System Technical Journal, volume 34, page 1149, November 1955. Another device using field effect principles and termed the field effect varistor is disclosed in the application of E. I. Doucette, H. A. Stone, Jr. and R. M. Warner, Jr., Serial No. 700,319, filed December 3, 1957, now Patent No. 2,954,486.

Investigation and study in connection with the foregoing noted devices has led to the discovery of a new semiconductor device in which are combined certain of their features to produce devices having novel characteristics of operation, useful as, among others, a nonmodulating electronically variable resistor, an impedance inverter, a short-circuit stable negative resistance element and as a solid state transformer.

An object of this invention therefore is a new and improved field effect semiconductor device.

Another object is a solid state variable resistor having improved characteristics.

A further object is a semiconductor device suitable for use as an impedance inverter over a wide frequency range.

Another more specific object of this invention is a short-circuit stable negative resistance element.

Another specific object is a solid state device having transformer-like characteristics.

In one broad aspect the semiconductor device in accordance with this invention comprises a semiconductor body containing a PN junction defined by two thin regions of differing conductivity type. These regions advantageously may have portions of minimum cross-sectional area produced by trenches or like reductions in the cross section of the body. Each conductivity-type region has a pair of low resistance connections applied thereto at or near the extremities of the region. Thus, a voltage difference between the one and the other electrode of a conductivity-type region will cause a majority carrier current flow through the region. The sign of the voltage difference between the opposing electrodes on opposite sides of the junction will determine whether the junction is forward or reversed biased.

In the operation of the device in accordance with this invention, the voltage at each one of the four electrodes is such that the junction always is reverse biased and thus a depletion layer is induced adjacent the junction, the thickness of which is a function of the voltage difference across the junction. The current channel in a given region is generally defined by a volume between the boundary of the depletion layer and a free surface of the body. The resistance to current flow through either of the regions is an inverse function of the cross section of this current channel. Thus, it is apparent that the resistance to current flow in either semiconductor region is controllable by altering the voltage difference between the electrodes on opposite sides of the PN junction and of both extremities of the body.

Thus, the device may be characterized as a pair of thin semiconductor current channels separated by a PN junction and having electrodes at each end of both channels to provide a four-terminal element.

Further, in accordance with one specific embodiment of this invention, the foregoing described four-terminal device has a variable bias source connected to the electrodes on opposite sides of the junction and at one end of the device. The signal or other voltage whose current is under control is serially connected with one of the conductivity-type regions or channels and thus is connected to the electrodes at the two ends of one of the conductivity-type regions. Capacitors connected across the opposed electrodes at each end of the device block the bias current from the signal circuit.

Thus, the configuration described constitutes an electronically variable resistor whose resistance can be controlled by the application of a bias voltage to a remote terminal of the device. Changes in the bias voltage applied across the junction effect changes in the extent of the depletion layer. Such changes, in combination with the structurally reduced cross section of the midpoint of the device, provide majority current channels of varying cross section to and beyond the pinch-off condition which is the condition at which the depletion layer boundary intersects the surface of the body.

Thus, a feature of the electronically variable resistor is that the bias circuit does not draw current, nor does the current in the resistor interact with the circuit supplying the bias. Also, the current in the resistor does not itself modulate the resistance, that is, the majority carrier current flowing in a region does not affect the extent of the depletion layer in that region. In other words, for a given bias voltage the resistance of the semiconductor is a constant and independent of the signal voltage.

In other specific embodiments of this invention, the relative voltages of each of the four electrodes may be adjusted so as to produce mutual currents in each of the channels of the device so as to provide characteristics rendering the particular configuration useful as a negative resistance, an impedance inverter, or a transformer. It is important to note that in these arrangements the device provides power gain as a consequence of inherent field effect transistor characteristics. Thus, it is a further feature of this invention that variable bias sources may be applied to one or more of the four electrodes of the field effect device in accordance with this invention so as to provide several different useful modes of operation.

The invention and its other objects and features will be understood more clearly from the following detailed description taken in connection with the drawing in which.

Figure 1:
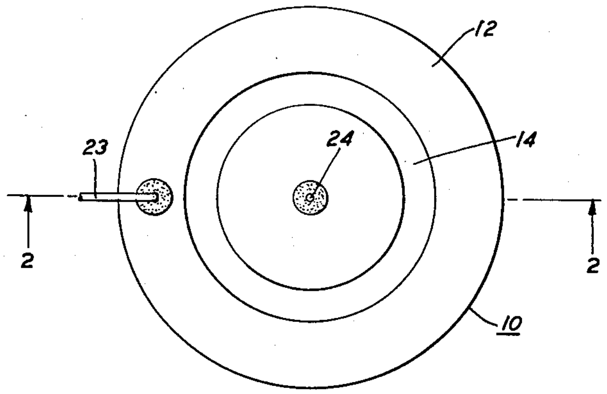
FIGS. 1 and 2 are schematic diagrams of one embodiment of the field effect tetrode.
Figure 2:
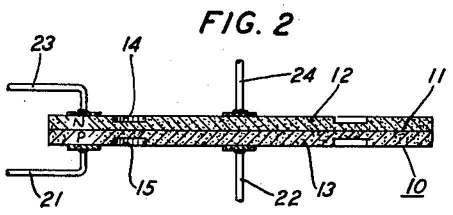

The basic form of the semiconductor element is shown in FIGS. 1 and 2. It will be appreciated that this representation, as well as others of the drawing, is exaggerated in certain dimensions to facilitate a clearer understanding of the invention. The semiconductor device 10 comprises a wafer of single crystal silicon produced from a slice of material refined and grown using techniques well known in the art. Typically, the starting material for producing this element is a slice of P-type conductivity silicon having a resistivity of 20 ohm centimeters and having a thickness of .015 inch. This slice was subjected to a phosphorus diffusion treatment by heating in a furnace after painting it with a solution consisting of phosphorus pentoxide mixed in ethylene glycol monomethyl ether for a period of 12 hours at a temperature of 1300 degrees centigrade. This process produced an N-type conductivity layer .0028 inch deep on both sides of the slice. One side of the slice was then lapped with an abrasive to reduce the slice thickness to .0056 inch and thereby place the junction in the middle of the slice. In order to facilitate the making of low resistance contact to this lapped P-type side, a thin layer of boron was diffused thereinto by coating the surface with a solution of boron oxide in ethylene glycol monomethyl ether and heating for an hour at about 1000 degrees centigrade.

The surfaces of the slice were then smoothed by liquid honing and gold plated. Using an ultrasonic cutting machine, the slice was divided into discs .100 inch in diameter. Next, again using the ultrasonic cutting machine, the circular trench of .060 inch mean diameter and .004 inch wide was cut concentrically in each side of the disc to a depth within .0013 inch of the junction. The P-type conductivity side of the disc was then covered with a wax mask and the N-type side was chemically etched.

Leads of .501 inch of fine gold wire having a .030 diameter nail head end were attached by compression bonding to the center islands of the disc. Similar gold contact wires were attached to the regions on the outer rim of the disc to produce the completed four-terminal device.

Final processing of the device included chemical etching of the N and P sides separately using wax masking to raise the channel resistances to optimum values. Using a CP–4 etch without bromine, successive treatments raised the P-type channel resistance to 2500 ohms at which electronic interaction between the two channels was observed. After further etching, this channel resistance rose to 7000 ohms at which value the device began to show a negative resistance characteristic indicating that the structure was generally satisfactory for use as a field effect tetrode.

Thus, the field effect tetrode 10 comprises a disc-shaped wafer of silicon having an N-type region 12 and a P-type region 13 defining a PN junction 11 therebetween. A circular trench 14 is provided in the N-type surface and a similar trench 15 in the P-type surface. Both trenches provided a portion of reduced cross section wherein control of current flow by depletion layer penetration is effective. Low resistance electrodes 21 and 23 connect to the peripheral portion of the device outside of the trench and similar electrodes 22 and 24 connect to the center portions. Thus, current flow occurs between the center portion and the peripheral portion on both sides of the junction 11.

Figure 3:
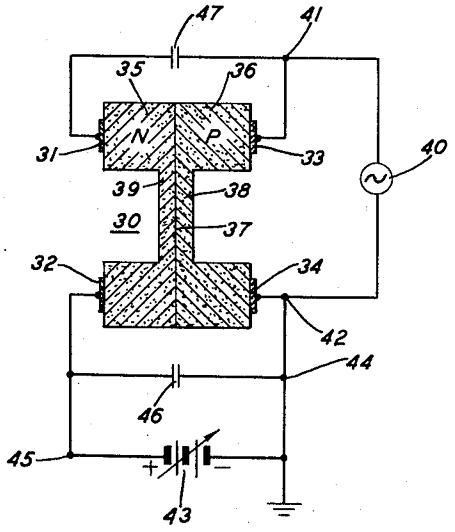
FIG. 3 shows the field effect tetrode in a circuit arrangement for use as an electronically variable resistor.

One advantageous use of the field effect tetrode is shown in FIG. 3. In this configuration the tetrode 30, shown in simplified diagrammatic form, has low resistance electrodes 31, 32, 33 and 34 connected thereto. The N-type region 35 and P-type region 36 define between them a PN junction 37. The current control channels are in the portions 38 and 39 of reduced cross section on both sides of the junction.

To use the device as an electronically variable resistor, a source 40 of the signal being controlled is connected to the terminals 41 and 42. A variable bias voltage source 43 is connected to terminals 44 and 45. The capacitors 46 and 47 are connected to the electrodes at the ends of the device and prevent circulation of direct current from the bias source 43 from entering the alternating current signal circuit.

Figure 4:
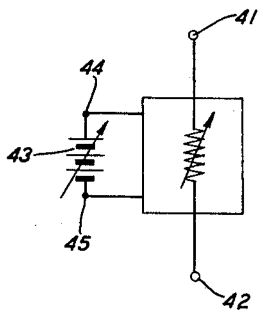
FIG. 4 is a black box equivalent of the device of FIG. 3.

FIG. 4 shows an equivalent device in diagrammatic or "black box" form with reference numerals corresponding to those of FIG. 3. Thus, the voltage or signal being controlled, as well as the load being supplied, are not shown but would be connected across the terminals 41 and 42 in either series or parallel arrangement in a manner well known in the art. A biasing source 43 for varying the resistance of the device is connected to the terminals 44 and 45.

The magnitude of the reverse bias applied from the variable voltage source 43 across the junction 37 substantially determines the extent of the depletion layer on both sides of the junction. Thus, as the bias voltage increases in the reverse direction, the depletion layer becomes larger to the condition termed "pinch-off" at which the boundary intersects a surface of the trench. Pinch-off will not occur necessarily in both channels simultaneously, the sequence largely being a function of the initial impurity distribution and thickness of both conductivity-type regions.

More specifically, the depletion layer thickness in both channels, and consequently the channel resistances, are determined at one end by the voltage $V_{31}-V_{33}$, and at the other by the voltage $V_{32}-V_{34}$, where the subscript indicates the terminal at which the voltage V is taken. The capacitors 46 and 47 typically may have a value of .01 microfarad for a signal frequency of one megacycle. The primary requirement with respect to the capacitors is that they are sufficiently large so that their reactance at the signal frequency is insignificant compared to the channel resistance.

In this circuit the signal path goes through the two channels 38 and 39 in parallel. Because there is only the reverse leakage current flow across the junction, the bias voltage will appear all along the N-type channel. The fact that the signal voltage passes through the channels in parallel and does not appear across the junction has several advantageous consequences. First of all, the junction capacitance is not effective in the signal circuit and does not constitute a frequency limitation. Secondly, the signal itself does not modulate the channel resistance. Thus, for a given bias the resistance is constant even for large signals. Thirdly, the signal voltage cannot break down the junction and therefore the signal power is limited only by the heat dissipation characteristics of the semiconductor element.

For a typical field effect tetrode having a "step" junction, the bias voltage range is from about zero to one hundred volts. A step junction is known in the art as one having a relatively steep impurity distribution curve. A substantially linear relation between bias voltage and resistance was observed up to the point where the resistance was about three times as great as the resistance at zero bias voltage. The resistance is controllable to a value of about one hundred times greater than the resistance at zero bias voltage with an increasing departure from linearity. A very marked advantage of this device is that virtually no bias power is required because the only bias current is the very small reverse leakage in the junction.

It will be appreciated that although bias voltages generally are referred to herein in terms of direct current, they also may be in the form of alternating current so long as the frequency thereof is separable from the signal being controlled. Thus, in certain circuit configurations isolating elements may comprise filter networks instead of simple capacitances and resistances.

Figure 5:
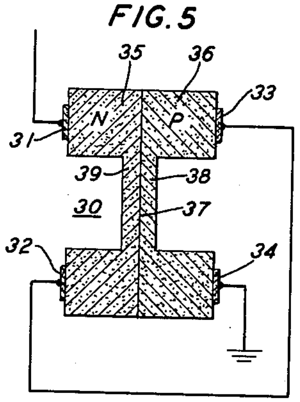
FIG. 5 depicts the field effect tetrode connected for use as a short-circuit stable negative resistance element.

The configuration of FIG. 5 illustrates the field effect tetrode used as a negative resistance element. It is apparent that this arrangement constitutes a two-terminal device and it can be demonstrated that the arrangement is inherently short-circuit stable.

Figure 7:
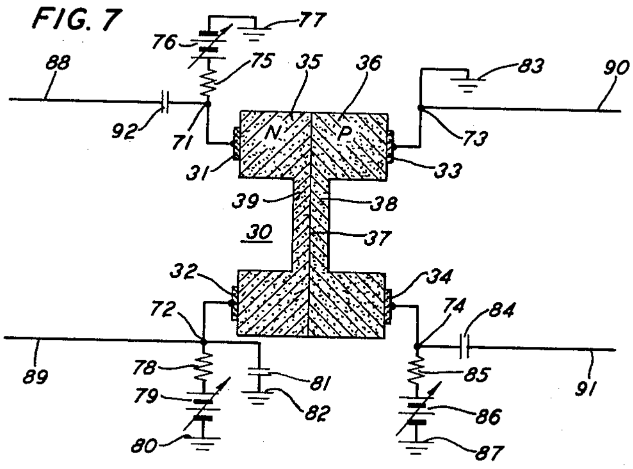
FIGS. 7 and 8 show the field effect tetrode connected in particular circuit arrangements.
Figure 8:
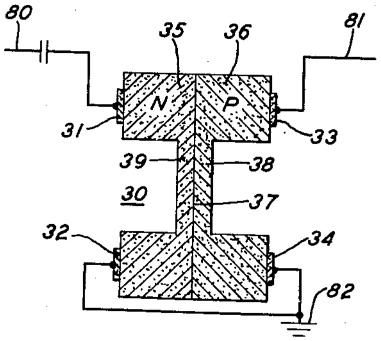

In FIG. 5, as well as FIGS. 7 and 8, like reference numerals denote like structural elements. Thus, the semiconductor body of FIG. 5 includes four low-resistance electrodes 31, 32, 33 and 34. However, the terminals 32 and 33 are interconnected, thus, in effect, connecting the N- and P-type channels in series. The external voltage is applied at terminal 31 and terminal 34 is connected to ground. As set forth hereinbefore, the potential difference across the junction at one end is $V_{31}-V_{33}$ and at the other is $V_{32}-V_{34}$. Thus, the depletion layer penetration is, in general, greater at one end than the other depending on the relative values of these potential differences. The depletion layer boundary as a consequence generally is not a parallel plane but is a surface whose distance from the junction varies nonlinearly along the channel.

The midpoint voltage, expressed as $V_{32}$ or $V_{33}$, is a dependent variable determined by the externally applied voltage $V_{31}$ and the constants of the semiconductor device. In this configuration the current must be the same in both channels and thus the midpoint voltage $V_{32}$ assumes a value such that the voltage drops in the two channels are inversely proportional to their conductances. The conductances are variable because the effective current-carrying thickness of the channels is reduced by depletion layer penetration, which, in turn, is a function of the voltage.

Figure 6:
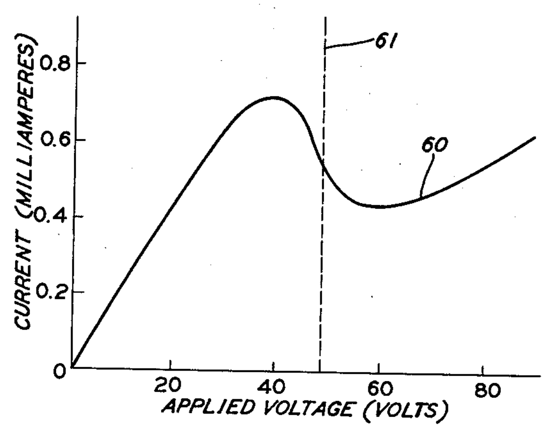
FIG. 6 is a graph depicting the current voltage characteristic of the device of FIG. 5.

As the applied voltage increases in the reverse direction, the sum of the potential differences across the junction at the two ends, expressed as $V_{31}-V_{33}$ at the top, and $V_{32}-V_{34}$ at the bottom, increases and, therefore, the net depletion layer penetration into the channel advances. Thus, in field effect transistor terminology each channel serves as a gate for the other and the potential along either channel is a function of the current in the other. Therefore, the field effect tetrode, connected as shown in FIG. 4, is a device in which the channel resistance as determined by the depletion layer penetration, rises more rapidly than the voltage. Hence, the current decreases, even with a rising voltage to produce the negative resistance characteristic depicted by the curve 60 in the graph of FIG. 6. The short-circuit stability of the device is apparent from the fact that any short-circuit line, such as the dotted line 61, intersects curve 40 in only one point.

Turning to FIG. 7, the field effect tetrode is shown in a configuration suitable for use as an impedance inverter or gyrator. It will be understood that this arrangement is illustrative and that in actual circuits some of the components may be combined or otherwise more conveniently arranged. For example, the separate variable bias sources 79 and 86 might be combined in one direct-current source with two separately controlled outputs.

In the arrangement of FIG. 7, a field effect tetrode 30 is connected to the leads 88 and 89 on one side of the device and the leads 90 and 91 on the other side of the device. Variable bias sources 76, 79 and 86 are connected through terminals 71, 72 and 74 to each of the electrodes 31, 32 and 34. These direct-current biases are applied through isolating resistors 75, 78 and 85 and are connected on their other sides to common ground, designated 77, 80 and 87. Blocking capacitors 84 and 92 are provided on both sides of the device and alternating-current ground connections are shown on the opposite corners of the tetrode connected to terminals 72 and 73. These ground connections are shown as 82 and 83. Ground connection 82 is purely an alternating-current ground by reason of the blocking capacitor 81. Connection 83 is a ground connection for both alternating current and direct current.

In this configuration a field effect tetrode is used as a nonreciprocal device by adjusting the relative potentials of the four electrodes so that the current in both channels is in the same direction. It is, of course, necessary to maintain the potentials of the four electrodes at values such that a reverse bias exists at all times across the junction. The relative voltages at the four terminals for these specified conditions may be expressed in the following terms:

For the condition of reverse bias (1) $(V_{31}-V_{33})\geqslant 0$ and (2) $(V_{32}-V_{34})\geqslant 0$ For the condition of parallel current flow in the downward direction in both channels (3) $(V_{31}-V_{32})>0$ (4) $(V_{33}-V_{34})>0$ Under the foregoing prescribed conditions, if the voltage at electrode 31 is increased, this produces an increase in the reverse bias across the junction, thus increasing the depletion layer penetration and increasing the channel resistance. The effect therefore is to reduce the current in the right hand or P-type channel which represents a change in current opposite in sense to the direction of current flow in this channel. If, on the other hand, the voltage at electrode 33 is increased, in effect rendered less negative, the reverse bias across the junction is reduced and the effect is to reduce the channel resistance in both channels. Therefore, more current flows in the N-type channel and the change in current is an increase or alteration having the same sense as the direction of current flow in that channel. Thus, the device exhibits phase inversion of the current-voltage relation demonstrating the nonreciprocal character of this circuit configuration.

The location of the alternating-current grounding points affects the mode of operation of the device. The configuration, shown in FIG. 7, with the alternating-current grounds 82 and 83 at opposite corners of the tetrode will enable the transfer of the signal from one side of the element to the other by a fluctuation of the entire envelope of the depletion layer. This mode is relatively more efficient than the condition which obtains if the alternating-current grounds are made to the adjacent ends, for example, to the terminals 72 and 74. In such a configuration the fluctuation in the depletion layer boundary will be confined almost entirely to the portion of the envelope at one end of the tetrode away from the end to which the alternating-current ground connections are made.

FIG. 8 illustrates a further special application of the field effect tetrode in a four-terminal configuration. This configuration may be used to provide a transformer-like action and for this condition the relative potentials of the four electrodes may be defined as follows:

For a reverse bias condition similar to the configuration of FIG. 7

(1) $(V_{31}-V_{33})\geqslant 0$ and (2) $(V_{32}-V_{34})\geqslant 0$

However for transformer action the currents in the N and P-type channels are in opposite directions and therefore (3) $(V_{31}-V_{32})>0$ (4) $(V_{33}-V_{34})<0$ Thus, in the arrangement shown in FIG. 8, the device may be connected to a single input 80 through the blocking condenser and the electrode 33 will be connected to an output line 81. Electrodes 32 and 34 are shown connected to a common ground 82. If the voltage 31 is increased, the increase in reverse bias results in an increase in the P-type channel resistance and a reduction in the current which may be taken as flowing upward. Thus, the sense of the change in current flow is downward and opposite to the sense of the voltage increase at the electrode 31. If, on the other hand, the voltage at electrode 33 is increased, in effect rendered less negative, the reverse bias is decreased and the N-type channel resistance is thus reduced permitting more current to flow. Thus, the sense of the change in current on the N-type side is in the same direction as the current flow in the N-type channel, or downward. Again, this change in current is opposite in sense to the change in voltage at the electrode 33 and the device thus exhibits an effect analogous to that of a transformer.

The embodiments described above for use as an impedance inverter and transformer have advantageous operating characteristics from several standpoints. First of all, they have a wide frequency range with a lower limit extending substantially to a direct-current value. Further, these devices, based in part on field effect principles, provide power gain as a result of abstraction of current from the bias. This characteristic, in combination with the other signal translating properties previously described, provides devices unique in the art so far as is known.

It will be understood that the invention has been described in terms of certain specific embodiments which are but illustrative and other arrangements may be devised by those skilled in the art which likewise will be within the scope and spirit of the invention. For example, semiconductor devices in accordance with this invention may have additional conductivity-type regions adjacent the two regions to which the electrodes are attached. Under certain circumstances it will be desirable from the standpoint of fabrication and encapsulation to provide such additional layers. Furthermore, using solid state diffusion and masking techniques now well known in the art, it is possible to provide a PN junction boundary which is the equivalent of the surface containing the trench which produces the region of reduced cross section for achieving the pinch-off condition. However, when such alternative structures are used, only the central two contiguous conductivity-type regions will have electrodes.

What is claimed is:

1. A semiconductor device comprising a body of semiconductive material consisting of two contiguous regions of opposite conductivity type defining a single PN junction therein, said body having only four electrodes attached thereto, said electrodes consisting of first and second electrodes making low resistance contact to spaced-apart portions of one of the regions and defining a first current channel therebetween, third and fourth electrodes making low resistance contact to spaced-apart portions of the other region and defining a second current channel therebetween, said channels providing means for substantially parallel current flow, each said channel having a characteristic value of pinch-off current, and means for biasing said junction in the reverse direction.

2. A semiconductor device in accordance with claim 1 in which each of said regions of opposite conductivity type has a portion of greatly reduced cross section between said spaced-apart low resistance electrodes.

3. Signal translating apparatus comprising in combination a semiconductor device in accordance with claim 1 in combination with first circuit means interconnecting said second and fourth electrodes, said first circuit means including a potential source for biasing said junction in the reverse direction, and second circuit means interconnecting said third and fourth electrodes, said circuit means including a signal source, and separate third and fourth circuit means interconnecting said first and third electrodes and said second and fourth electrodes respectively for conducting alternating current only.

4. Signal translating apparatus comprising in combination a semiconductor translating device in accordance with claim 1 and first circuit means connected to said first electrode, second circuit means directly interconnecting said second and third electrodes, and third circuit means connected to said fourth electrode and to ground.

5. Signal translating apparatus of the nonreciprocal type comprising in combination a semiconductor translating device in accordance with claim 1 and first and second circuit means connected to said first and second electrodes respectively, and third and fourth circuit means connected to said third and fourth electrodes respectively, potential sources connected to at least three of said electrodes for biasing said junction in the reverse direction and for producing current flow in the same direction in both said conductivity type regions, capacitance means in said circuit means for isolating said circuit means from said bias sources, and circuit means for applying alternating current ground potential to at least two of said four electrodes.

6. Signal translating apparatus of the reciprocal type comprising in combination a semiconductor translating device in accordance with claim 1 and first circuit means connected to said first electrode and second circuit means connected to said third electrode, said first and second circuit means including capacitance means for preventing conduction of direct currents, and third circuit means directly interconnecting said second and fourth electrodes and for applying ground potential to said electrodes.

7. A field effect tetrode comprising a wafer of semiconductor material having two major faces, said wafer having a region of P-type conductivity adjacent one face and an N-type region adjacent the other face, said regions defining a substantially planar PN junction laterally disposed within said wafer, each face of said wafer having a continuous trench therein separating said face into a central portion and a peripheral portion, the bottom of said trenches approaching but not intersecting said PN junction, a pair of low resistanec electrodes connected to each of said conductivity-type regions, one of said pair being applied to said central portion and the other to the peripheral portion of each face, and means for biasing said junction in the reverse direction.

8. A field effect tetrode comprising a wafer-like disc of semiconductive material having two major faces, said disc having a region of P-type conductivity adjacent one face and an N-type region adjacent the other face, said regions defining a substantially planar PN junction laterally disposed within said disc, each face of said disc having a concentric annular trench therein separating said face into a central portion and a peripheral portion, the bottom of said trenches approaching but not intersecting said PN junction, a pair of low resistance electrodes connected to each of said conductivity type regions, one of said pair being applied to said central portion and the other to the peripheral portion of each face, and means for biasing said junction in the reverse direction.

9. A field effect tetrode comprising a wafer-like disc of semiconductive material having two major faces, said disc having a region of P-type conductivity adjacent one face and an N-type region adjacent the other face, said regions defining a substantially planar PN junction laterally disposed within said disc, each face of said disc having a concentric annular trench therein separating said face into a central portion and a peripheral portion, both said annular trenches having the same diameter and having a depth approaching but not reaching said PN junction, a pair of low resistance electrodes connected to each of said conductivity-type regions, one of said pair being applied to said central portion and the other to the peripheral portion of each face, and means for biasing said junction in the reverse direction.

10. A semiconductor device comprising a body of semiconductive material having the configuration of a right circular cylinder, said body including first and second contiguous regions of opposite conductivity type defining a substantially planar PN junction which extends normally to the axis of the cylinder, first and second electrodes making low resistance contact to the first region at central and peripheral portions respectively, third and fourth electrodes making low resistance contact to central and peripheral portions respectively, each of the two regions including a portion of greatly reduced cross section between the electrodes in contact therewith, and means for biasing said junction in the reverse junction.

References Cited in the file of this patent

UNITED STATES PATENTS

| | | |
|---|---|---|
| 2,570,978 | Pfann | Oct. 9, 1951 |
| 2,709,232 | Thedieck | May 24, 1955 |
| 2,816,228 | Johnson | Dec. 10, 1957 |
| 2,936,425 | Shockley | May 10, 1960 |